United States Patent [19]

Choi et al.

[11] Patent Number: 4,951,112
[45] Date of Patent: Aug. 21, 1990

[54] TRIPLE-POLY 4T STATIC RAM CELL WITH TWO INDEPENDENT TRANSISTOR GATES

[75] Inventors: Tat C. Choi, Milpitas; Richard K. Klein; Craig S. Sander, both of Mountain View, all of Calif.

[73] Assignee: Advanced Micro Devices, Inc., Sunnyvale, Calif.

[21] Appl. No.: 280,782

[22] Filed: Dec. 7, 1988

Related U.S. Application Data

[63] Continuation of Ser. No. 88,215, Jan. 28, 1987, abandoned.

[51] Int. Cl.$^5$ .................... H01L 27/11; G11C 11/412
[52] U.S. Cl. .................... 357/41; 357/23.9; 357/59; 365/154
[58] Field of Search .................... 365/154, 51, 63; 357/41, 23.9, 59

[56] References Cited

U.S. PATENT DOCUMENTS

| | | | |
|---|---|---|---|
| 3,949,383 | 4/1976 | Askin et al. | 365/154 |
| 4,023,149 | 5/1977 | Bormann et al. | 365/154 |
| 4,240,097 | 12/1980 | Raymond, Jr. | 357/59 F |
| 4,525,811 | 6/1985 | Masuoka | 357/41 |
| 4,679,171 | 7/1987 | Logwood et al. | 357/41 |

FOREIGN PATENT DOCUMENTS 60-254653 12/1985 Japan .................... 365/154

OTHER PUBLICATIONS

Geipel, Jr. et al., IEEE Trans. on Electron Devices, vol. ED27, No. 8, Aug. 1980, p. 1417.

Primary Examiner—William D. Larkins
Attorney, Agent, or Firm—Salzman & Levy

[57] ABSTRACT

A 4T static RAM cell (10) comprising a flip-flop with two pull-down transistors (18, 20) and two pass-gate transistors (12, 14) is fabaricated employing two separate gate oxide formations (74, 76) and associated separate polysilicon depositions (52a -b, 56). Two reduced area contacts (58, 60) connect to the nodes (26, 30) of the circuit (10). The reduced area butting contacts comprise vertically-disposed, doped polysilicon plugs (94), which intersect and electrically interconnect buried polysilicon layers (load poly 88, gate poly 52a) with doped silicon regions (80) in a bottom layer. Adding the processing steps of forming separate gate oxides for the pull-down and pass-gate transistors results in a smaller cell area and reduces the requirements of the contacts from three to two. Further, the separate gate oxidations permit independent optimization of the pull-down and pass-gate transistors.

5 Claims, 3 Drawing Sheets

TRIPLE-POLY 4T STATIC RAM CELL WITH TWO INDEPENDENT TRANSISTOR GATES

DESCRIPTION

The present application is a continuation of patent application Ser. No. 088,215, filed Jan. 28, 1987, now abandoned.

CROSS-REFERENCE TO RELATED APPLICATION

The present application is related to application Ser. No. 944,150, filed Dec. 17, 1986 for "Reduced Area Butting Contact Structure", now abandoned in favor of continuation application Ser. No. 230,696, filed Aug. 5, 1988, and assigned to the same assignee of the present application. The related application is directed to reduced area contacts formed by a two-step anisotropic etch procedure, the first step being non-selective between oxide and polysilicon and the second step being selective to silicon (and polysilicon), etching silicon oxide much faster. The present application is directed to a reduced area, four-transistor static random access memory cell having a symmetrical layout, two independent gate layers and only two contacts. The contacts disclosed and claimed in the related application are utilized in the present application to further reduce the cell layout area.

BACKGROUND OF THE INVENTION

1. Field of the Invention

The present invention relates to static random access memory (RAM) cells, and, more particularly, to a reduction in the cell size of static RAMs using four-transistor cells.

2. Description of the Related Art

A conventional four-transistor (4T) RAM cell consists of a two transistor, two resistive-load flip-flop plus two access transistors (known as word-line or pass-gate transistors), such as described in S. M. Sze, *VLSI Technology*, McGraw-Hill, NY, pp. 473-478 (1983). One characteristic of such a cell is that its circuit diagram requires some type of interconnection cross-over. Given a conventional two-polysilicon 4T static RAM process, which uses a single gate polysilicon (gate poly) layer, the requirement for this interconnection cross-over leads to an asymmetrical layout. In addition to the layout area required for the active circuit elements of this cell, this asymmetrical configuration typically requires the use of significant layout area for at least three contacts as well as added diffusion and polysilicon regions for interconnection purposes.

SUMMARY OF THE INVENTION

Accordingly, it is an object of the present invention to provide a four-transistor static RAM cell with improved layout efficiency.

It is another object of the present invention to provide a four-transistor static RAM cell which has a symmetrical layout.

It is yet another object of the present invention to provide a four-transistor static RAM cell having only two contacts.

It is a still further object of the present invention to provide a four-transistor static RAM cell having reduced layout area.

Briefly, a structure for a four-transistor static RAM cell formed on a semiconductor substrate is provided. The structure is characterized by a layout in which two of the transistors employ a first gate layer and the other two transistors employ a second gate layer. In particular, such a cell is commonly configured with a flip-flop with two pull-down transistors and two pass-gate transistors, and in one embodiment, a first pass-gate transistor is placed adjacent and in series with a first pull-down transistor and a second pass-gate transistor is placed adjacent and in series with a second pull-down transistor. The first pass-gate and pull-down transistors share a first common node, while the second pass-gate and pull-down transistors share a second common node.

The gate layers may be formed from a variety of materials, such as polysilicon or refractory metals, particularly molybdenum or tungsten. Refractory metal silicides, particularly molybdenum, tungsten, titanium and tantalum silicides, can be formed on top of polysilicon to comprise polycide layers. In the embodiment described below, polysilicon will be specified as the gate material, because it is the material most commonly used at present. This should not be construed so as to limit the use of other gate materials.

A symmetrical layout may be achieved by placing one pass-gate/pull-down transistor pair adjacent the other, rotated by 180°.

The use of two separate gate polysilicon depositions allows the use of independent gate oxide thicknesses for the pass-gate and pull-down transistors. Forming gate oxides of separate thickness enables the pull-down transistors to be optimized for higher transconductance, thereby reducing the widths of these devices and saving layout area.

The structure is further characterized by the use of only two contacts, one providing an electrical connection between the first common node, a polysilicon segment connected to the gate of the second pull-down transistor and a first resistive load, and the other providing an electrical connection between the second common node, a polysilicon segment connected to the gate of the first pull-down transistor and a second resistive load.

The novel layout of the memory cell is achieved by employing a triple poly process, with two separate gate oxidations and two separate polysilicon depositions for the gates. The third polysilicon deposition is a conventional formation of the load poly, portions of which are appropriately doped to provide both a high-resistance load and a low-resistance interconnect. To maintain cell balance, one of the gate poly depositions is used to form the two pass-gate transistors and the second gate poly deposition is used to form the two pull-down transistors.

While the novel layout reduces cell area and the number of contacts required, further area reduction is achieved by employing a novel reduced area contact, which employs a suitably doped, polysilicon plug for electrically interconnecting one or more isolated levels of poly (load poly, gate poly) with a doped silicon region in the substrate. The triple poly cell layout of the invention enjoys a 30 to 40% reduction in cell area over the layout of a conventional double poly memory cell.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Figure 1:
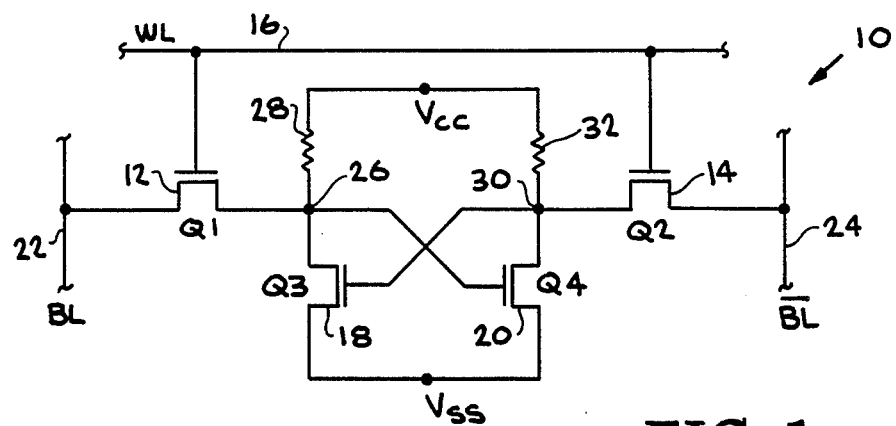
FIG. 1 is a schematic diagram of a conventional 4T static RAM cell.

A typical 4T static RAM cell 10 has the circuit diagram shown in FIG. 1. The circuit of the cell 10 comprises two pass-gate transistors Q1 12 and Q2 14, connected to a word-line 16, and a flip-flop comprising two pull-down transistors Q3 18 and Q4 20. Bit-lines 22 and 24 are denoted by BL and $\overline{BL}$, respectively, while word-line 16 is denoted by WL. Transistors 12 and 18 share a common node 26, to which a resistive load 28 and the gate of transistor 20 are connected. Transistors 14 and 20 share a common node 30, to which a resistive load 32 and the gate of transistor 18 are connected.

Figure 2:
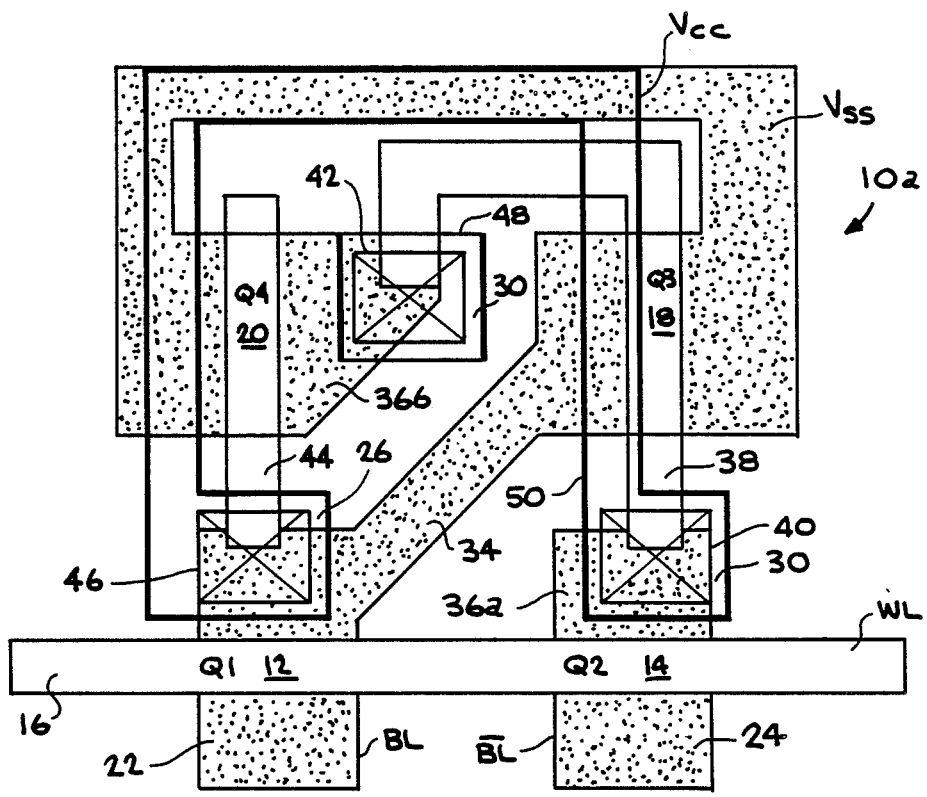
FIG. 2 is a top plan view of an exemplary layout resulting from conventional processing.

FIG. 2 shows a conventional layout, denoted generally at 10a, used to achieve the 4T static RAM cell with the circuit diagram 10 shown in FIG. 1. Though other layouts are possible, features and cell sizes are similar to the prior art described here.

In the layout shown in FIG. 2, it will be noted that diffusion region 34 forms a direct connection between pull-down transistor Q3 18 and pass-gate transistor Q1 12, whereas, the diffusion regions 36a, 36b of pass-gate transistor Q2 14 and pull-down transistor Q4 20 are isolated from each other by diffusion region 34 and must be connected using two contacts and an interconnecting segment. In this case the interconnecting segment is a polysilicon segment 38 and the two contacts are contacts 40, 42.

Though other layout variations exist, it is a common characteristic of prior-art contemporary 4T static RAM cells that a direct diffusion-region connection between the pass-gate transistors Q1 12 and Q2 14 and the pull-down transistors Q3 18 and Q4 20 is possible for only one of the two pass-gate/pull-down transistor pairs. The diffusion regions of the other pass-gate/pull-down transistor pair are distinct and are, in fact, isolated from each other by the common diffusion region of the first pass-gate/pull-down transistor pair. The fact that both pass-gate/pull-down transistor pairs cannot be connected directly results in the use of substantial layout area for routing and interconnection purposes.

It is also a common characteristic of prior-art 4T static RAM cells that, due to their non-symmetrical layout, the parasitic resistances and capacitances associated with the connection between the pass-gate and pull-down transistors of the two pass-gate/pull-down transistor pairs do not match or balance. In order to maintain cell stability and prevent loss of data during sensing and as a result of these parasitic imbalances, it may be necessary to further increase the size of pull-down transistors over the requirements needed if a symmetrical layout were possible.

To complete the description of the cell layout of FIG. 2, a gate poly 44 interconnects pull-down transistor 20 with diffusion region 34 via a contact 46. Each of the contacts 40, 42, 46 is covered and overlapped by load polysilicon (load poly) layer segments 48, 50. Elements 16, 38 and 44 are all polysilicon segments formed from the gate polysilicon layer.

It is necessary that a load poly layer segment overlap the contact holes 40, 42, 46 by an amount sufficient to ensure complete coverage of the contact holes even under the conditions of worst-case misalignment and other process variations. This overlap is required to prevent the etching of contacted polysilicon segments or diffused regions during the patterning of the load poly layer segments 48, 50. Such etching of these contacted layers could cause the cell to fail.

Reference is now made in detail to a specific embodiment of the present invention, which illustrates the best mode presently contemplated by the inventors for practicing the invention. Alternative embodiments are also briefly described as applicable.

To reduce the cell size, the use of a second independent layer of gate poly is utilized. This requires two separate gate oxidations and two separate polysilicon depositions, instead of the prior art process employing one gate oxidation and one gate poly deposition. In order to maintain cell balance, it is important that the two pass-gate transistors Q1 12 and Q2 14 are made from the same gate poly while the two pull-down transistors Q3 18 20 and Q4 20 are made from the other gate poly.

Figure 3:
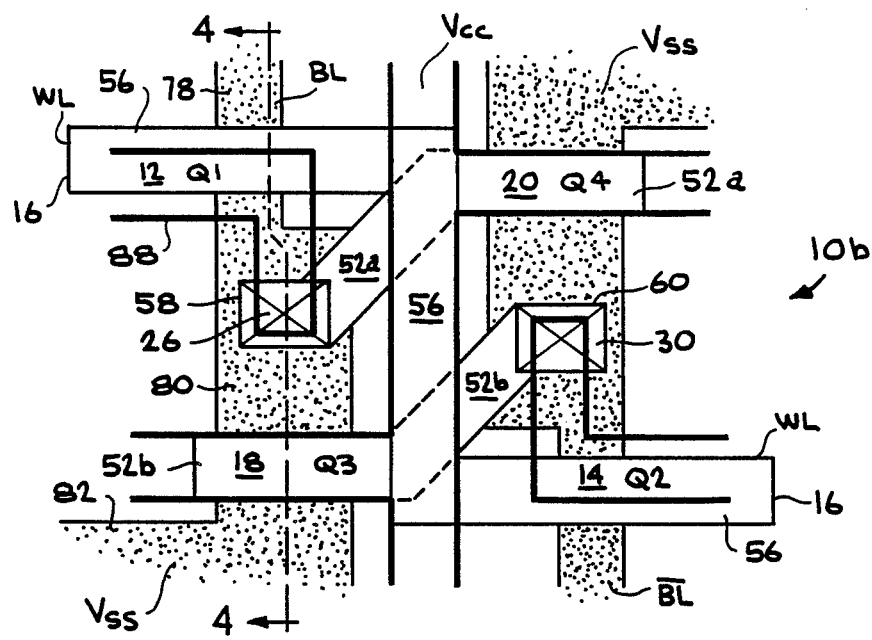
FIG. 3 is a top plan view of a layout achieved in accordance with the teachings of the invention.

One layout which realizes this is shown in FIG. 3. This layout, denoted generally at 10b, also uses a contact structure and layout which is different from the conventional contact. Details of this contact are described below. Use of this new contact structure ties in with the use of two independent gate polysilicon layers to provide a 30 to 40% reduction in cell area.

In the symmetrical layout of FIG. 3, a first pass-gate transistor Q1 12 is adjacent and in series with a first pull-down transistor Q3 18. This pass-gate/pull-down transistor pair shares a first common node 26. A second pass-gate transistor Q2 14 is adjacent and in series with a second pull-down transistor Q4 20 and this pass-gate/pull-down transistor pair shares a second common node 30. These pass-gate/pull-down transistor pairs are placed adjacent each other, with one pair having a 180° rotation relative to the other, thereby achieving a symmetrical layout.

This layout has the added advantage of having the gates of the pull-down transistors 20, 18 lying almost directly adjacent the common node 26, 30, respectively, to which they are to be connected. This arrangement minimizes the length of the first layer polysilicon segments 52a, 52b. The interconnection cross-over is achieved by placing the second-layer polysilicon segment 56 (wordline 16) over the first polysilicon layer segments 52a, 52b. Using this second layer polysilicon segment 56 as the cross-over saves valuable layout area by reducing the number of contacts from three to two (58, 60) and by obviating the need for the routing of a diffusion region or first layer polysilicon in order to accomplish a cross-over.

An additional advantage with this cell is that the pull-down transistors 18, 20 can have a different gate oxide thickness than that of the pass-gate transistors 12, 14. This allows the gate oxide thicknesses to be individually optimized, thus saving cell area.

For example, a typical static RAM requires the transconductance ($g_m$) of the pull-down transistors Q3 18, Q4 20 to be two to three times that of the pass-gate transistors Q1 12, Q2 14. This is done to prevent the cell from changing state while being sensed. In a conventional cell, the pass-gate transistors Q1 12, Q2 14 are drawn to minimum dimension while the pull-down transistors 18, 20 have channel widths two to three times larger. Using a process with two gate polys, the pull-down transisisstors Q3 18, Q4 20 can use thinner gate oxides to increase their transconductances over those of the pass-gate transistors 12, 14. Therefore, the channels do not need to be as wide, and valuable cell layout area can be saved.

The thickness of the gate oxide of the pull-down transistors Q3 18, Q4 20 may range from about 125 to 250 Å, and preferably from about 125 to 150 Å, while the thickness of the gate oxide of the pass-gate transistors Q1 12, Q2 14 may range from about 200 to 400 Å, and preferably from about 200 to 250 Å.

A thinner gate oxide is possible for the pull-down transistors Q3 18 and Q4 20 because significant current flow in these transistors occurs only during sensing. During this instant, the maximum drain voltage is limited by the sensing circuitry to less than about 4 volts. These reduced voltage levels allow the use of a thinner gate oxide while avoiding reliability problems due to hot electron effects. It should be noted that these thinner gate oxide transistors can also be used in other circuitry to improve performance so long as drain voltages are appropriately limited.

The process sequence used to form a two gate poly layout such as shown in FIG. 3 is depicted in FIGS. 4a-f and, except as noted herein, employs conventional NMOS (N-channel metal oxide semiconductor) processes. However, it will be appreciated that other MOS processes, such as PMOS and CMOS, may also be used in the practice of the invention.

The processing sequence described below is directed to the formation of a pass-gate/pull-down transistor pair Q1 12, Q3 18, with butting contact 58 formed therebetween. It will be appreciated that the second pass-gate/pull-down transistor pair Q2 14, Q4 20, with contact 60 therebetween, is formed simultaneously therewith. A conventional field oxide (not shown in the processing sequence) separates the two transistor pairs.

P-region 70 is formed in a semiconductor layer 72, such as silicon, lightly doped to about $5 \times 10^{14}$ cm$^{-3}$ (sheet resistivity about 20 Ω-cm). The dopant materials and concentrations and the process used to form the region 70 are well-known and thus do not form a part of this invention.

For the sake of clarity, some processing steps such as forming channel stops are omitted. However, such processing steps, which would normally be employed, may also be employed in the processing sequence herein at the appropriate times; the processing sequence that is described herein is abbreviated and is intended to focus on those steps that result in the desired layout.

Next, a field oxide (not shown) is grown to separate one pass-gate/pull-down transistor pair Q1 12, Q3 18 from the other pair Q2 14, Q4 20. The conditions of the field oxide growth are conventional and well-known.

Figure 4A:
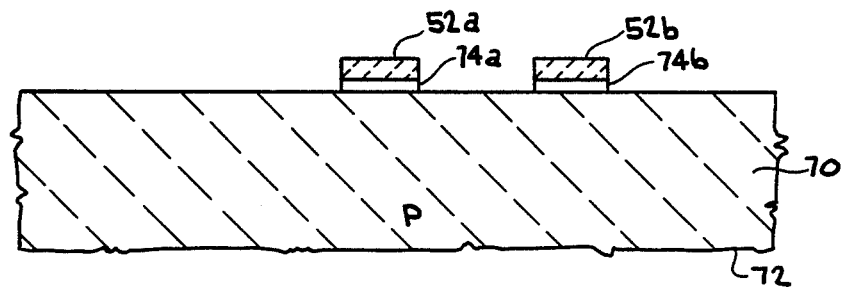
FIGS. 4a-f depict, in a cross-sectional view taken along the line 4—4 of FIG. 3, the sequence of processing steps to form the layout shown in FIG. 3.

A first polysilicon gate (poly 1 gate) is formed over gate oxides 74a, 74b and defined to form polysilicon segments 52a, 52b, respectively. The resulting structure is shown in FIG. 4a. Polysilicon segment 52a is formed as a segment of the gate for transistor 20 (not visible in FIGS. 4a-f). Segment 52b is associated with transistor 18.

Figure 4B:
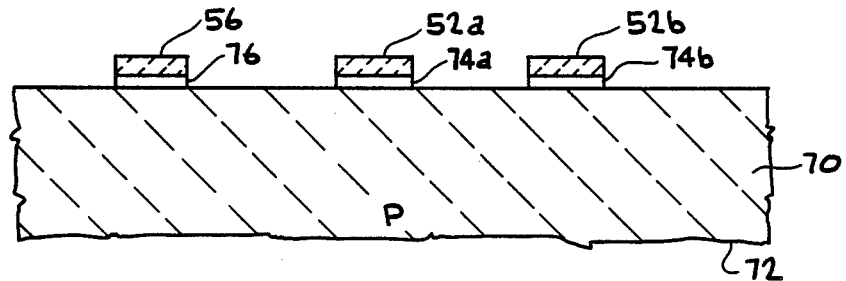

A second gate oxide 76 is then separately grown. A second polysilicon gate (poly 2 gate) is formed over the gate oxide 76 and defined to form polysilicon segment 56, as shown in FIG. 4b. The polysilicon segment 56 is associated with transistor 12.

Figure 4C:
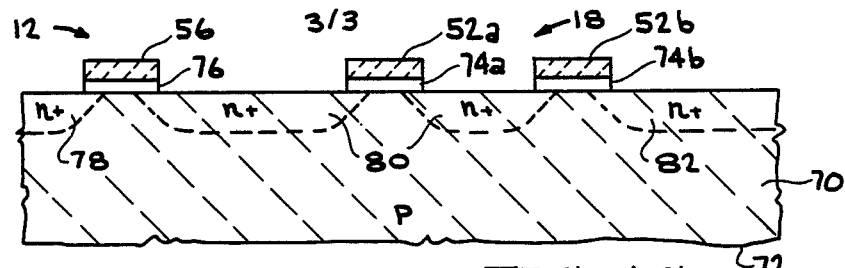

Respective source and drain regions 78, 80, 82 are formed by conventional processing, such as by implantation and diffusion. The resulting structure is depicted in FIG. 4c.

Figure 4D:
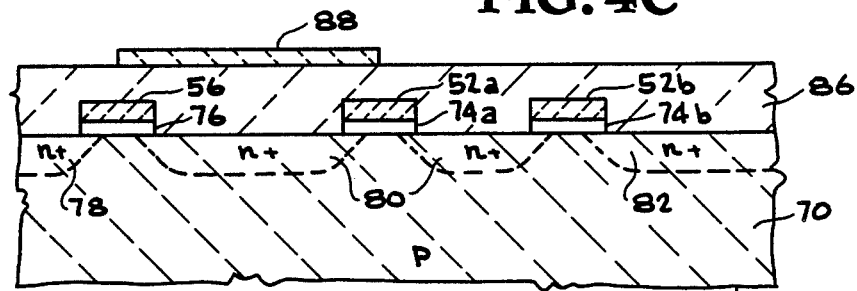

A thick oxide layer 86 is formed to a thickness of about 5,000 Å by conventional processes, and a third polysilicon layer is formed on the oxide layer, and defined to form portion 88, overlying the gates 52a, 56. The poly layer 88 is implanted to the level required to provide a resistive load, typically about 2 to $5 \times 10^{13}$ cm$^{-2}$, having a high sheet resistance of about 20 to $200 \times 10^9$ ohms per square. The structure is shown in FIG. 4d. The poly layer 88 is then defined and masked, and those portions (not shown) employed as connectors are given an additional higher implant dosage to a level of about 1 to $5 \times 10^{15}$ cm$^{-2}$, to provide a lower sheet resistance of about 50 to 1000 ohms per square.

An additional oxide layer 90 is formed over the entire surface and planarized to a thickness of about 5,000 Å, and a contact opening 92 is opened through to the underlying doped region 80. While this process to form reduced area butting contacts is the subject of a separate patent application as herein above cited and filed by the assignee of the present application, briefly, the process employs a two-step anisotropic etch procedure, the first step being non-selective between oxide and polysilicon and the second step being selective to silicon (and polysilicon), etching silicon oxide much faster.

The first etch step is carried out until the contact opening 92 is etched through and beyond the poly layer 88. After etching through the load poly layer 88, the etchant is switched to one that is selective to silicon, etching silicon oxide and stopping at the doped silicon region 80. Where a gate poly 52a is also present, as here, the selective etchant etches past the gate poly, without appreciably etching the gate poly itself.

Next, the opening 92 is filled with polysilicon plug 94, which is appropriately doped (N+ to N+ doped silicon, P+ to P+ doped silicon) to form a conductive link from the buried poly layers 52a, 88 to the doped region 80.

While the plug 94 has been described as comprising doped polysilicon, it will also be appreciated that the plug may comprise other conductive materials which may be conformally deposited. An example of such a material is tungsten.

Openings (not shown) are also formed through the oxide layers 86, 90 to underlying doped areas, in order to make ohmic contact with appropriate portions of the circuit. Such openings may also be advantageously filled with a conformable, conductive material such as described above.

Figure 4E:
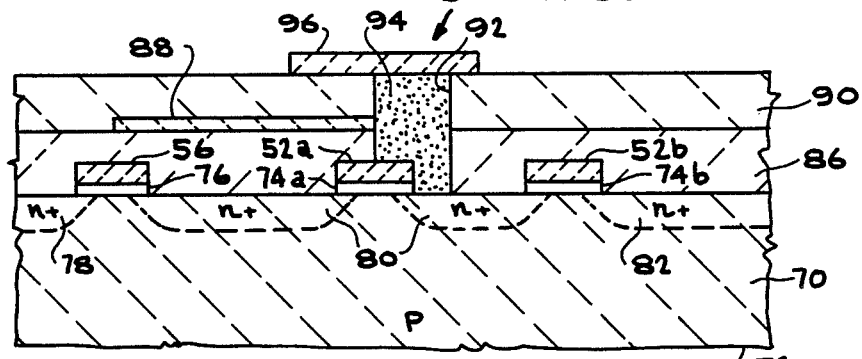

After the plug 94 is formed, an oxide layer 96 is deposited over the plug and defined, so as to permit crossover of subsequently-deposited metal layer 98 without shorting to the polysilicon plug. The structure is shown in FIG. 4e.

Figure 4F:
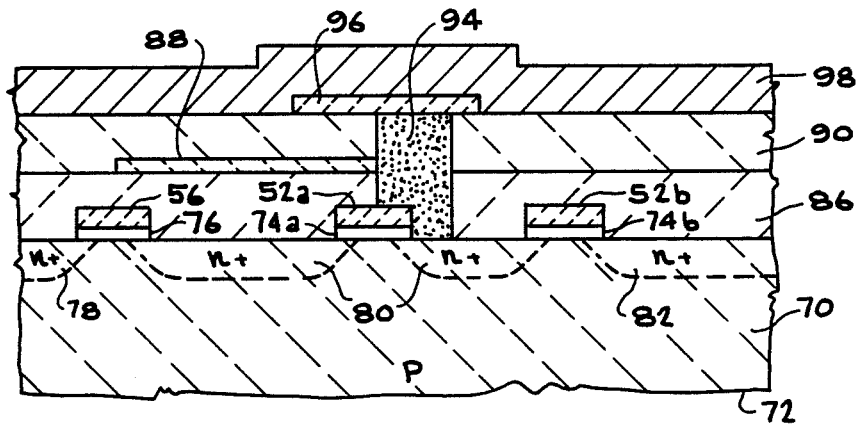

Metal layer 98 is then deposited and defined. Such a metal layer 98 is used to complete the ohmic contact to other portions of the circuit, as appropriate. The structure is depicted in FIG. 4f.

The metal layer 98 may comprise any of the metals compatible with the chemistry of the particular semiconductor and associated insulating compounds. For silicon-based technology, employing silicon oxide insulating materials and doped and undoped polysilicon, the metal layer 98 conveniently comprises an aluminum alloy.

It will be appreciated that use of reduced area contacts in conjunction with two separate gate oxide and polysilicon gate layers results in a layout 10b of a memory cell 10 that is considerably smaller than that of the prior art and has fewer contacts. Further, due to the symmetry achieved, the cell 10 is more stable to interrogation. Finally, the use of separate gate oxide formations permits independent optimization of pull-down and pass-gate transistors in the cell 10.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS, CMOS or bipolar processes or combinations thereof. Similarly, any process steps described might be interchangeable with other steps in order to achieve the same result. This embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. In a structure of an insulated gate field effect transistor static random access memory cell, comprising two pass-gate insulated gate field effect transistors and a flip-flop with two pull-down insulated gate field effect transistors, each pass-gate field effect transistor and each pull-down field effect transistor comprising source and drain semiconductor regions of first conductivity type spaced from each other by a channel region of second, opposite conductivity type, each channel being overlaid by a gate conductor separated from the corresponding channel by a gate insulator layer, the source to drain path of one pass-gate transistor being coupled in series with the source to drain path of one pull-down transistor at a first node, the source to drain path of the other pass-gate transistor being coupled in series with the source to drain path of the other pull-down transistor at a second node, with the gate of said one pull-down transistor being connected to said second node and the gate of said other pull-down transistor being connected to said first node to form said flip-flop, the improvement comprising: said one pass-gate transistor being located adjacent said other pull-down transistor, and said other pass-gate transistor being located adjacent said one pull-down transistor, such that said pull-down transistors and said pass-gate transistors form a physically symmetrical structure, the gate conductor of said one pass-gate transistor and the gate conductor of said other pass-gate transistor being parts of a physically continuous conductor member which passes from said one pass-gate transistor, through an area between said pull-down transistors, to said other pass-gate transistor.

2. The random access memory cell of claim 1, wherein said pull-down transistors have a gate insulator comprising an oxide in a thickness ranging from about 125 to 250 Angstroms.

3. The random access memory cell of claim 1 wherein said conductor member comprises polysilicon.

4. The random access memory cell of claim 1, wherein the gate insulators of said pass gate transistors and the gate insulators of said pull-down transistors each comprise an oxide, the gate insulator oxides of said pull-down transistors being thinner than the gate insulator oxides of said pass-gate transistors.

5. The random access memory cell of claim 1, wherein said gate-pass transistors have a gate insulator comprising an oxide in a thickness ranging from approximately 200 to 400 Angstroms.

* * * * *